United States Patent [19]
Sasaki et al.

[11] Patent Number: 6,035,528
[45] Date of Patent: Mar. 14, 2000

[54] METHOD OF MANUFACTURING ELECTRONIC COMPONENTS

[75] Inventors: Toshiya Sasaki; Kazuyoshi Uchiyama; Masahiko Kawaguchi, all of Takefu; Katsuhiro Misaki, Fukui; Katsuji Matsuta, Sabae, all of Japan

[73] Assignee: Murata Manufacturing Co., Ltd., Japan

[21] Appl. No.: 09/095,540

[22] Filed: Jun. 10, 1998

[30] Foreign Application Priority Data

Jun. 26, 1997 [JP] Japan ................................ 9-187876

[51] Int. Cl.⁷ .......................... H01R 43/16; B23P 17/00
[52] U.S. Cl. ........................... 29/874; 29/413; 29/426.1; 83/929.2
[58] Field of Search ..................... 29/874, 413, 426.1; 83/56, 929.1, 929.2

[56] References Cited

U.S. PATENT DOCUMENTS

| 4,372,046 | 2/1983 | Suzuki | 29/852 |
| 4,486,738 | 12/1984 | Sadlo et al. | 29/413 |
| 5,140,745 | 8/1992 | McKenzie, Jr. | 29/413 |
| 5,477,062 | 12/1995 | Natsume | 257/48 |
| 5,600,101 | 2/1997 | Sakai | |

FOREIGN PATENT DOCUMENTS

| 0726642 | 8/1996 | European Pat. Off. . |
| 43 06 655 A1 | 9/1993 | Germany . |

OTHER PUBLICATIONS

Patent Abstracts of Japan—Publication No. 61131470 dated Jun. 19, 1986.

*Primary Examiner*—P. W. Echols
*Attorney, Agent, or Firm*—Graham & James LLP

[57] ABSTRACT

A method of manufacturing an electronic component includes forming a slit in a connecting electrode located on the surface of a mother substrate such that the slit extends in a direction intersecting a cutting line, and cutting the mother substrate along the cutting line while cutting the connecting electrode having the slit. The connecting electrode is thereby reliably exposed on two opposing cut surfaces, and the reliability of external connection of the electronic component is improved.

21 Claims, 6 Drawing Sheets

METHOD OF MANUFACTURING ELECTRONIC COMPONENTS

BACKGROUND OF THE INVENTION

1. Field of the Invention

The present invention relates to a method of manufacturing electronic components, and more particularly, to a method of manufacturing a plurality of electronic components including a step of cutting a mother substrate, having an electrode on its surface, along predetermined cutting lines to thereby produce a plurality of individual electronic components each having an electrode exposed on opposed cut surfaces thereof.

2. Description of the Related Art

A well-known chip-type coil component in which an electrode pattern (thin-film coil pattern) is disposed on the surface of a substrate, is manufactured by cutting a mother substrate 51, which has a plurality of electrode patterns 52 formed thereon and is covered with an insulating and protective film 53 as shown in FIG. 7, along predetermined cutting lines A and B, thereby cutting out individual electronic components 54.

The insulating and protective film 53 is formed of, for example, a resin material such as a polyimide, or a glass material to achieve a desired surface smoothness, insulating properties, heat resistance, and suitability for micromachining required for the miniaturization of electronic chip components.

In a chip-type electronic component to be miniaturized, in particular, a chip-type coil component in which an electrode pattern (thin-film coil pattern) is disposed on a substrate, it is important to reliably provide a wide area for forming the electrode pattern in order to maintain and improve the performance of the component.

Accordingly, a dicing method for cutting with a dicing blade is used to cut out individual devices by cutting the mother substrate at predetermined positions.

This dicing method offers high working accuracy and can simultaneously cut the insulating and protective film. Also, this method does not require a cutting margin as is required in a scribe and break method. Further, this method allows the electrode pattern to be formed even on the outer peripheral part of the electronic chip component and ensures a wide area for use in forming the electrode pattern.

FIG. 8 is a cross-sectional view of an electronic component 54 which has been cut out from the mother substrate 51 shown in FIG. 7, in which outer electrodes 55 are arranged to be electrically connected to connecting electrodes 52a exposed on cut surfaces 51b.

In order to cut out the individual chip components 54 using the above-described dicing method so that the connecting electrodes 52a are exposed on the ends of each substrate 51a, it is necessary to cut the connecting electrodes (metal films) 52a over their full length across the overall width of the dicing blade in the case where the electrode patterns are formed as shown in FIG. 7. Since the cutting resistance of the connecting electrodes (metal films) 52a is generally greater than that of the mother substrate 51, the dicing blade wears significantly and experiences clogging. The clogging reduces the cutting force, which causes chipping of the mother substrate.

Furthermore, if adhesion between the connecting electrodes (metal films) 52a and the insulating and protective film 53 is not greater than adhesion between the mother substrate 51 and the insulating and protective film 53, peeling sometimes occurs not only at the insulating and protective film 53, but also at the connecting electrodes 52a during the step of cutting with the dicing blade, as shown in FIG. 9.

In addition, membrane stress produced during film formation sometimes remains in the connecting electrodes (metal films) 52a. As a result, the metal films 52a are more likely to peel when an external force is applied by cutting with the dicing blade.

SUMMARY OF THE INVENTION

To overcome the above problems, the preferred embodiments of the present invention provide a method of manufacturing electronic components which produces electronic components each having electrodes exposed on opposite cut surfaces, which is achieved by cutting a mother substrate having an electrode thereon. The method of manufacturing electronic components according to preferred embodiments of the present invention reduces the wear of a cutting blade and chipping of the mother substrate, prevents peeling of the electrode during the step of cutting the mother substrate, and allows efficient manufacture of electronic components configured to achieve a highly reliable external connection.

According to one preferred embodiment of the present invention, a method of manufacturing an electronic component includes the steps of providing a mother substrate having an electrode disposed thereon, forming at least one slit in the electrode located on a cutting line on the surface of the mother substrate so that the at least one slit extends in a direction that is substantially transverse to the cutting line, and cutting the mother substrate along the cutting line while cutting the electrode and across the at least one slit so as to expose the electrode on two opposing cut surfaces formed by the step of cutting the mother substrate.

Since the slit is formed in the electrode disposed on the cutting line on the surface of the mother substrate such that the slit extends in a direction which intersects the cutting line, and the mother substrate is cut along the cutting line with the cutting blade while cutting the electrode having the slit, it is possible to reliably expose the electrode at two opposing cut surfaces thereof, and to thereby improve the reliability of connections of the electrodes to an electrode of an external electronic component.

Furthermore, because the electrode has the slit formed therein, it is possible to shorten the distance of the electrode (metal film) to be cut by the cutting blade (that is, the amount to be cut) compared to the conventional methods in which the electrode has no slit formed therein. Thus, by shortening the distance and amount to be cut by the cutting blade, wear of the cutting blade is reduced and the life of the cutting blade is extended.

It is also possible to significantly prevent any decrease in the cutting force which is caused in conventional methods by clogging of the cutting blade and chipping of the mother substrate.

The formation of the slit in the electrode on the mother substrate also makes it possible to reduce the stress applied to the electrode, compared with the conventional method in which no slit is formed in the electrode on the mother substrate. As a result, peeling of the electrode during the cutting step is significantly reduced and with higher efficiency.

It is preferable that a length L of the slit in the direction intersecting the cutting line satisfies the following formula (1):

$$L > Wb + 2\alpha \tag{1}$$

where Wb represents the thickness of the cutting blade, and represents the amount of offset of the cutting position in the cutting blade thickness direction.

Since the length L of the slit in the direction intersecting the cutting line is preferably set so as to be greater than Wb+2α, the electrode is reliably exposed at the cut surfaces of the substrate by partly cutting the electrode even when the cutting position is offset, which makes electronic components manufactured according to preferred embodiments of the present invention more effective components, especially for reliable electrical connections to other external electronic components.

In the method of manufacturing electronic components, the mother substrate may be cut along the cutting line with the cutting blade after forming an insulating and protective film on the surface of the mother substrate having the electrode thereon. In this case, a pit and a projection are formed on the electrode by a portion where a slit is formed and an adjacent portion, and the insulating and protective film enters the pit, thereby securely fixing the electrode on the substrate. As a result, it is possible to prevent peeling of the electrode during the cutting step and to improve reliability of the electronic components produced by the method.

Furthermore, it is preferable that the thickness of the portion of the electrode on the mother substrate which is formed at least on the cutting line and provided with the slit is smaller than that of the remaining portion of the electrode.

In this case, it is possible to further reduce the amount of the electrode (metal film) to be cut by the cutting blade during the cutting step, to reduce the wear of the cutting blade, and to substantially prolong the life of the cutting blade. Since a plurality of ends of the cut electrode including the slit are exposed on the cut surfaces, electrical connection to the outer electrode will be significantly more reliable.

Furthermore, it is preferable that the electrode exposed on the cut surface is a connecting electrode which extends to an outer portion of the cut surface for connection to the outer electrode.

In this case, since the connecting electrode is exposed on the cut surface, the connection reliability to the outer electrode is significantly improved. In addition, the method of the preferred embodiments of the present invention results in an increased quality factor and increased inductance of the electronic component, decreased stray capacitance, and far more efficient manufacturing of a high-performance electronic component.

This brief summary has been provided so that the nature of the invention may be understood quickly. A more complete understanding of the invention can be obtained from the following detailed description of preferred embodiments while referring to the attached drawings.

Figure 9:
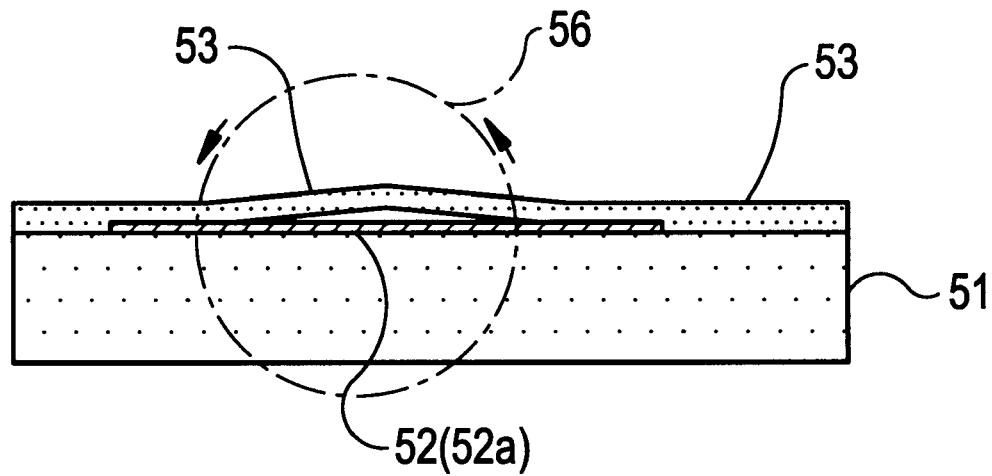
FIG. 9 is a view explaining a step of cutting the mother substrate with a dicing blade in the conventional electronic component manufacturing method.

Photograph 1 shows the state of electrode patterns of FIG. 9.

Figure 6:
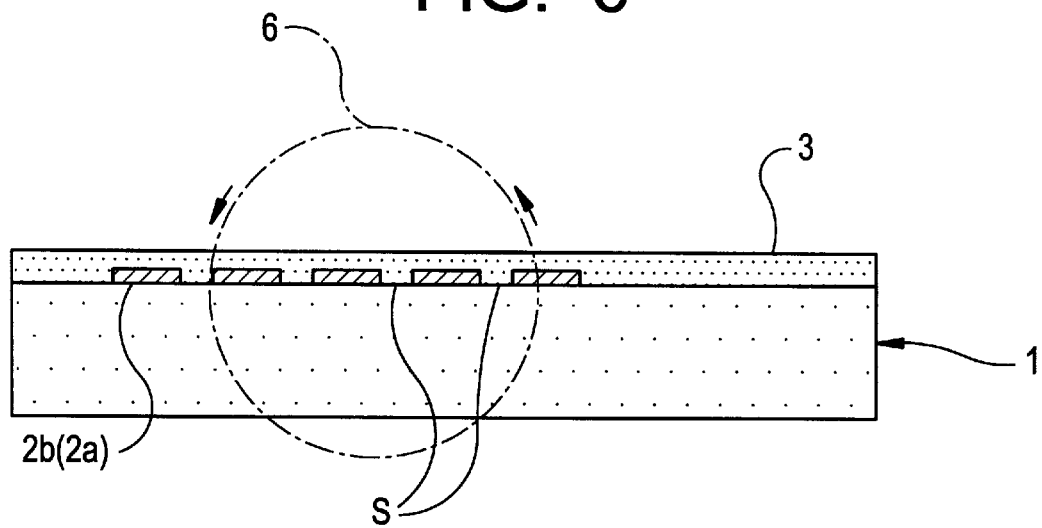
FIG. 6 is a view showing a state in which the mother substrate is being cut in a manufacturing method of a preferred embodiment of the present invention.
Figure 7:
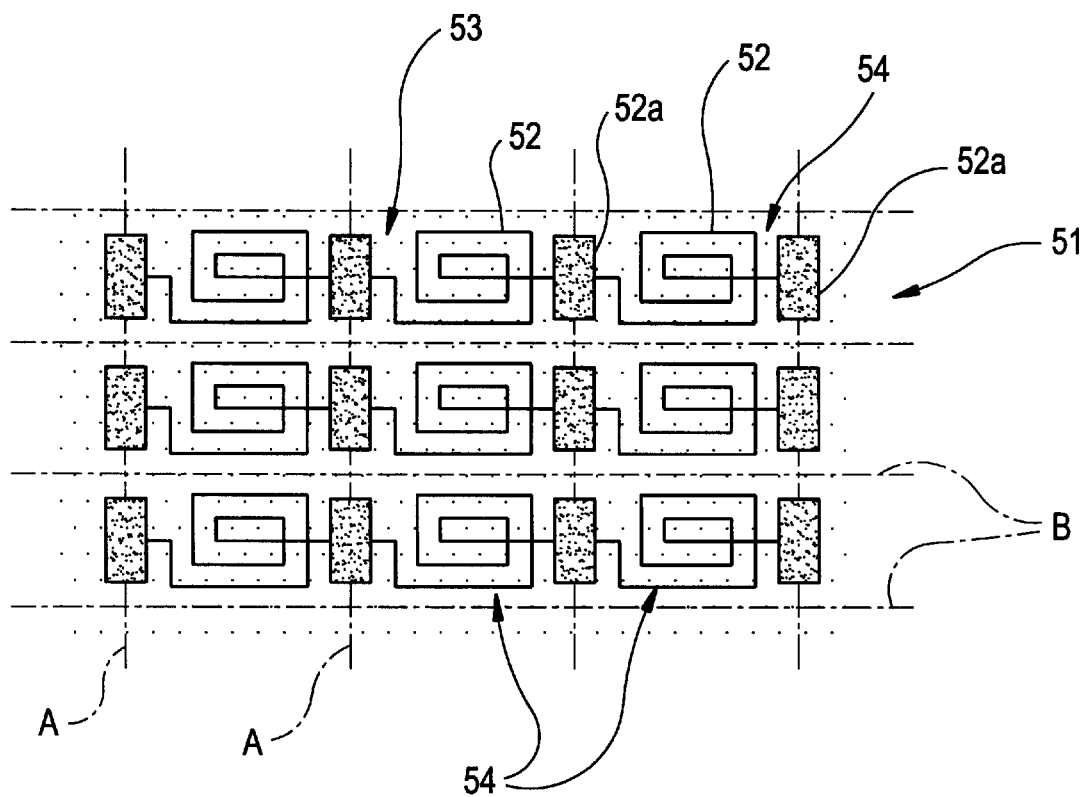
FIG. 7 is a view showing electrode patterns formed on a conventional mother substrate.
Figure 8:
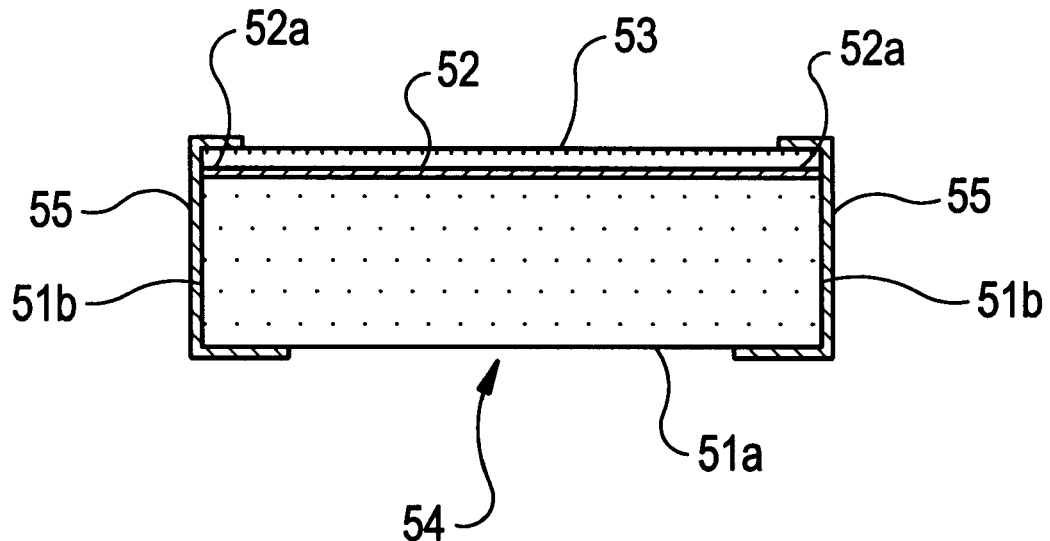
FIG. 8 is a frontal sectional view of an electronic component manufactured by a conventional method.

Photograph 2 shows a sectional surface of electrode patterns of FIG. 6 according to a preferred embodiment of the present invention.

DETAILED DESCRIPTION OF PREFERRED EMBODIMENTS

An electronic component manufacturing method according to a preferred embodiment of the present invention will be described below with reference to the attached drawings. In this preferred embodiment, a chip-type coil component is manufactured as an example of electronic components manufactured according to the method of the present invention.

Figure 4:
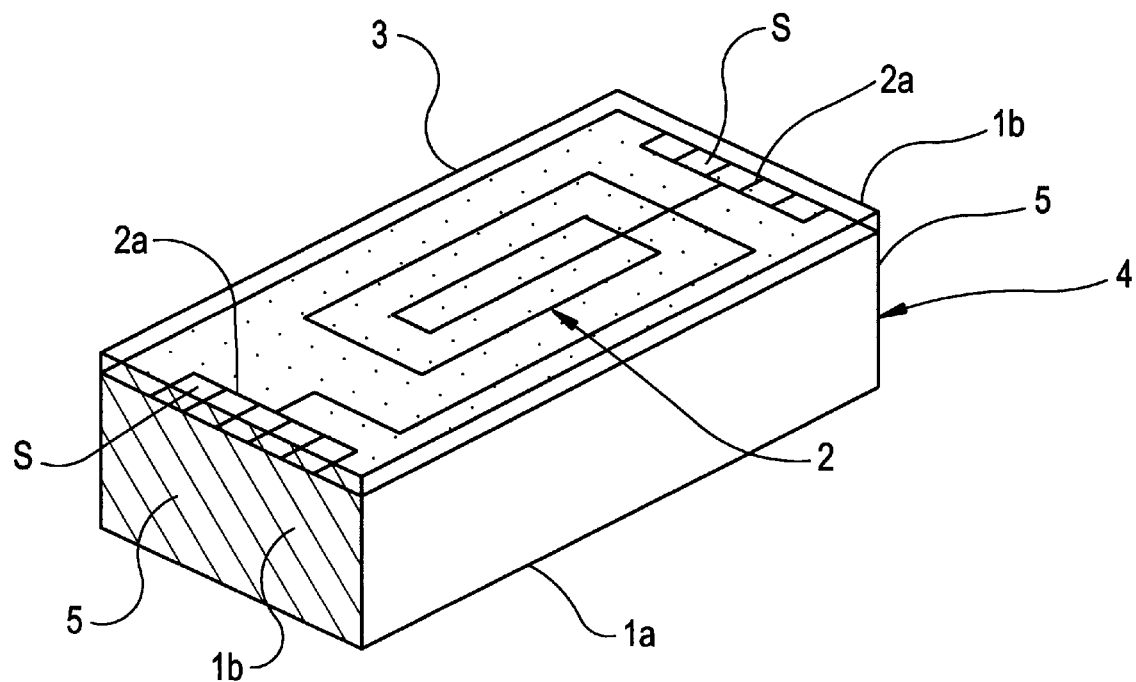
FIG. 4 is a perspective view of an electronic component (chip-type coil part) manufactured by the manufacturing method of a preferred embodiment of the present invention.

In the chip-type coil component, as shown in FIG. 4, a thin-film coil pattern (electrode pattern) 2 including connecting electrodes 2a, which are provided and arranged for external connection to other electronic components, is formed on the surface of a ceramic substrate 1a of a component 4, and the surface of the component 4 where the thin-film coil pattern 2 is formed is covered with an insulating and protective film (covering material) 3. Outer electrodes 5 are provided on portions of the component 4 where the connecting electrodes 2a are exposed so that they are electrically connected to the connecting electrodes 2a.

According to the manufacturing method of this preferred embodiment, an electrode film preferably made of metal, such as Ag or Cu, is first formed on a substrate preferably made of ceramic by a film forming method, such as sputtering, evaporation, ion-plating, plating, or thick-film printing.

Figure 1A:
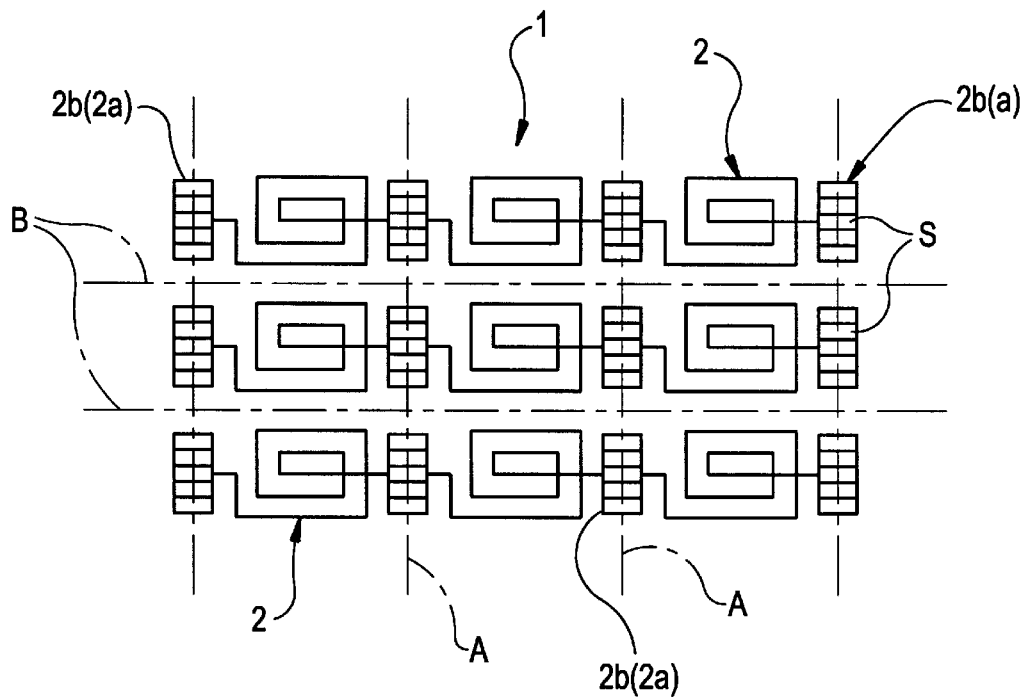
FIG. 1A is a plan view of a mother substrate that is provided with electrode patterns in one step of an electronic component manufacturing method according to a preferred embodiment of the present invention.
Figure 1B:
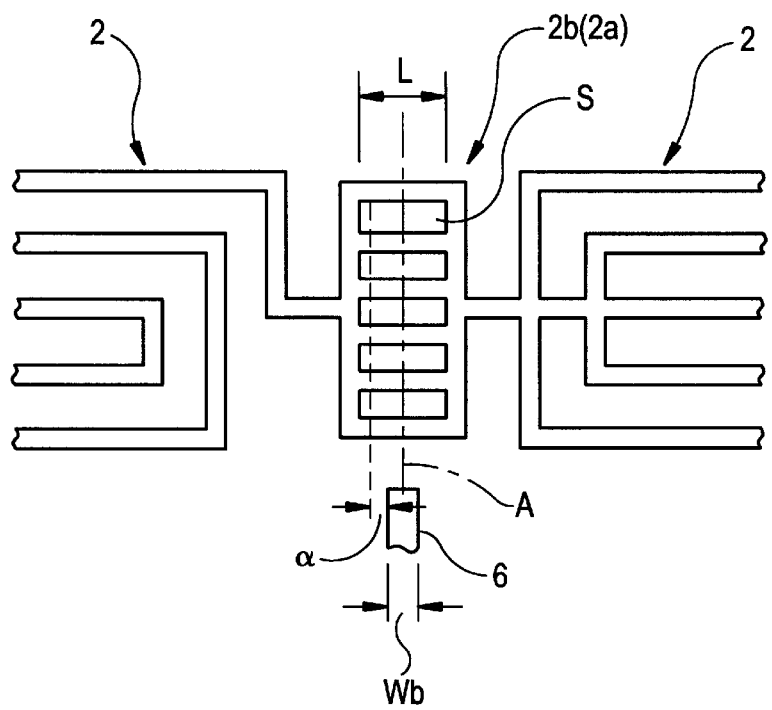
FIG. 1B is an enlarged view showing the principal part of the electrode patterns shown in FIG. 1A.

Next, the electrode film is etched by a known method, thereby producing a mother substrate 1 on which thin-film coil patterns (electrode patterns) 2 including connecting electrodes 2a are formed, as shown in FIG. 1.

Electrodes 2b in the electrode patterns 2, which serve as the connecting electrodes 2a (FIG. 4), are each provided with a plurality of slits S that intersect a cutting line A preferably at approximate right angles. The length L of these slits S is set so as to satisfy the condition: L>Wb+2α, where Wb represents the thickness of a cutting blade (dicing blade) 6 (FIG. 1B) for use in cutting the mother substrate 1, and α represents the amount of offset of the cutting position in the direction of the thickness of the cutting blade 6.

Figure 5A:
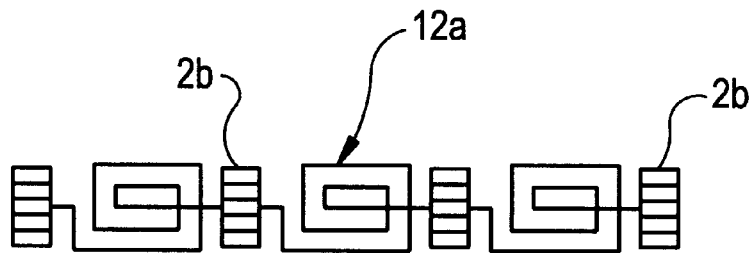
FIG. 5A is a view showing the electrode patterns formed on the surface of the mother substrate in the electronic component manufacturing method of a preferred embodiment.
Figure 5B:
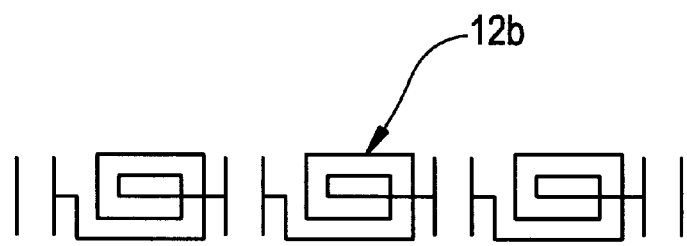
FIG. 5B is a view showing the electrode patterns formed on the surface of the mother substrate in the electronic component manufacturing method of a preferred embodiment.
Figure 5C:
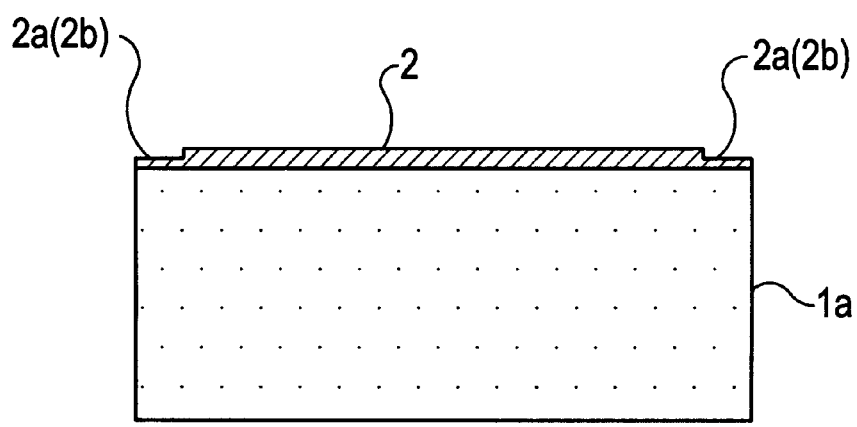
FIG. 5C is a cross-sectional view showing the thickness of the formed electrode patterns shown in FIGS. 5A and 5B.

In forming the electrode patterns 2 including the connecting electrodes 2b showen in FIG. 5B, for example, a first electrode film 12a having a smaller thickness than a desired thickness, which includes the electrodes 2b, is first formed on the surface of the mother substrate 1 as shown in FIG. 5A, and then, a second electrode film (thin-film coil pattern) 12b having no slit forming portion is formed thereon so as to have a thickness that is preferably substantially equal to the difference between the desired thickness and the thickness of the first electrode film 12a, as shown in FIG. 5C. Thereby, the thickness of the electrodes 2b serving as the connecting electrodes 2a is made smaller than that of the other part (the thin-film coil pattern) 2.

The thickness of the electrodes 2b can be made smaller than that of the other portion (the thin-film coil pattern) 2 by various methods, for example, the electrodes 2b are shaved and decreased in thickness by sandblasting or the like after the electrode pattern 2 including the electrodes 2b is formed.

Figure 2:
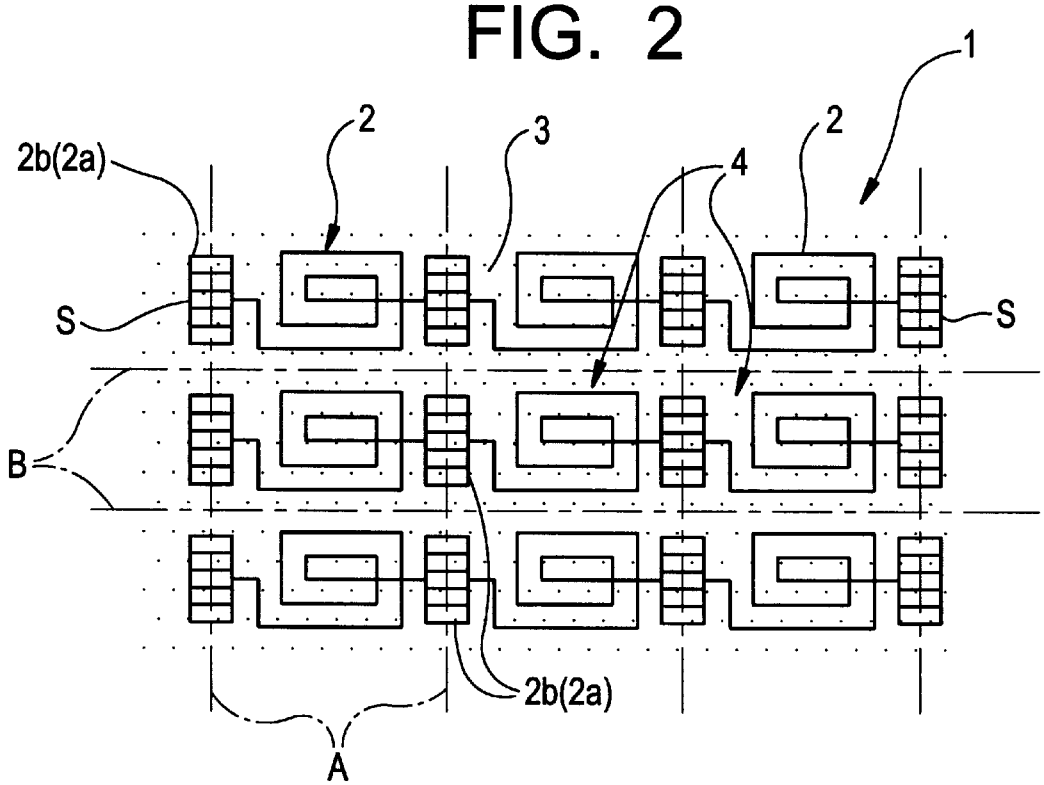
FIG. 2 is a plan view showing a state in which an insulating and protective film is disposed on the mother substrate having the electrode patterns formed thereon in one step of the electronic component manufacturing method of a preferred embodiment of the present invention.

Then, as shown in FIG. 2, an insulating and protective film 3 preferably made of a resin material such as polyimide, or an inorganic insulating material such as glass paste is formed so that it covers the surface of the mother substrate 1 having the thin-film coil patterns 2 disposed thereon.

Figure 3:
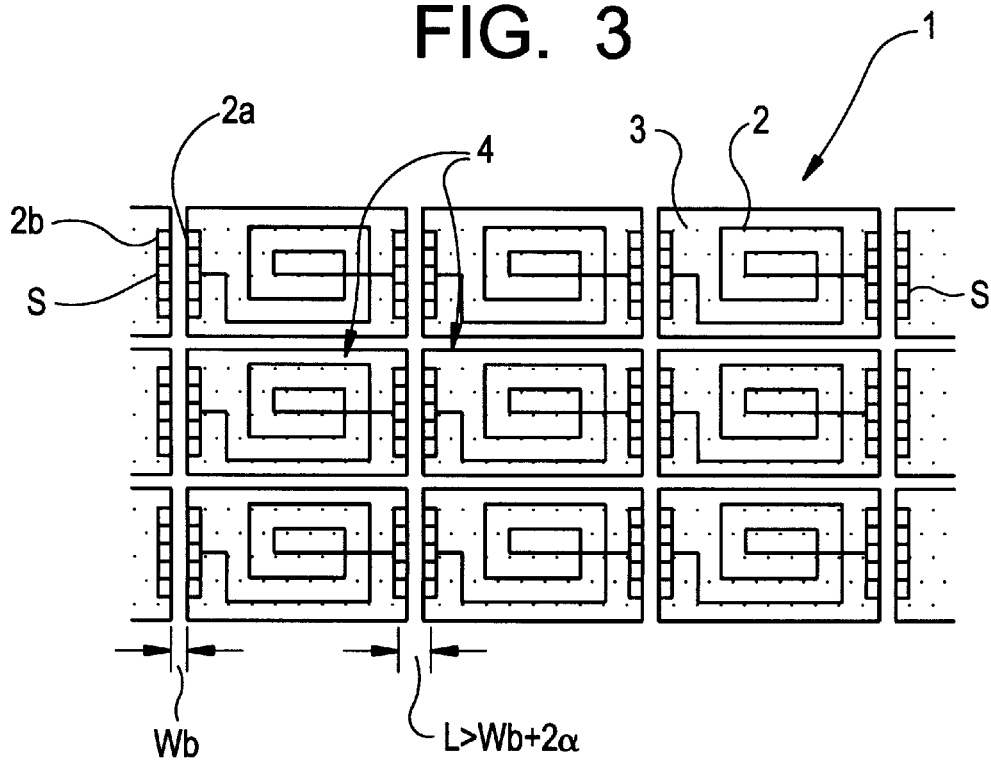
FIG. 3 is a plan view showing a state in which the mother substrate is cut along cutting lines in one step of the electronic component manufacturing method of a preferred embodiment of the present invention.

Next, the approximate centers of the connecting electrodes 2b (FIG. 4) on the mother substrate 1 are diced along the cutting lines A with the cutting blade 6 (FIG. 1B) that has the thickness Wb (primary cutting). The ends of the cut electrodes 2b are thereby exposed at the cut surfaces. After that, the mother substrate 1 is diced along cutting lines B (secondary cutting), thereby cutting out individual devices 4 (FIG. 3).

Then, the outer electrodes 5 made of metal, such as Ag, Cu, Cr, or Ni, are formed on portions of each component 4 including cut surfaces 1b (FIG. 4), where the connecting electrodes 2a are exposed, by sputtering or a combination of sputtering and plating so that they are electrically connected to the connecting electrodes 2a, thereby completing the electronic component (chip-type coil part) shown in FIG. 4.

While the outer electrodes 5 may be formed after cutting out the individual components, the outer electrodes 5 may be formed in the stage where the substrate has been primarily cut along the cutting lines A into strip-shaped parts each including a plurality of components. In this case, each strip-shaped part including the outer electrodes is divided into individual electronic components (chip-type coil parts) by secondary cutting. This makes it possible to simplify the manufacturing process, compared with the case in which the outer electrodes are formed after individual devices are cut out.

In the above-mentioned method of this preferred embodiment, the connecting electrodes 2a are each provided with the slits S having a length L (L>Wb+2α) that intersect the cutting line A at substantial right angles, and the mother substrate 1 is cut along the cutting lines A with the cutting blade 6 while cutting the electrodes 2b together with the slits S. Consequently, it is possible to reliably expose the electrodes 2b (connecting electrodes 2a) at two opposing cut surfaces 1b (FIG. 4), as shown in FIGS. 3 and 4, and to thereby improve the reliability of connection to the outer electrodes 5.

Furthermore, since each electrode 2b has the slits S, the amount of the electrode (metal film) 2b to be cut by the cutting blade 6 can be made smaller than a case where no slits S are formed. This makes it possible to reduce the wear of the cutting blade 6 and to thereby prolong the useful life of the blade 6.

It is also possible to significantly prevent any decrease in the cutting force of the cutting blade due to clogging and chipping of the substrate, and to thereby improve reliability of connection between the electrodes and the outer electrodes.

Since the mother substrate 1 with the electrode patterns 2 thereon is cut with the cutting blade 6 along the cutting lines A after the insulating and protective film 3 is formed on the surface of the mother substrate 1, pits and projections are formed on each electrode 2b by the portions having the slits S and the portions having no slits, as shown in FIG. 6, and the insulating and protective film 3 enters the pits, thereby securely fixing the electrode 2b on the mother substrate 1. This makes it possible to prevent the electrodes 2b from peeling during the cutting step, and to thereby improve reliability.

While the mother substrate is cut with the cutting blade after the insulating and protective film is formed on the electrode pattern in the above-mentioned preferred embodiment, it may be cut before forming the insulating and protective film. Moreover,.the present invention is also applicable to manufacturing of electronic components having no insulating and protective films. This case can also provide the same advantages as the basic advantages of the present invention of improving the reliability of connection to the outer electrodes by reliably exposing the electrodes at two opposing cut surfaces, of reducing the wear of the cutting blade by shortening the length of the electrode (metal film) to be cut by the cutting blade, and of limiting the reduction of the cutting force of the cutting blade due to clogging and chipping of the substrate.

Furthermore, in the above-mentioned method of this preferred embodiment, the connecting electrodes 2a for connecting the thin-film coil pattern 2 and the outer electrodes 5 are exposed on the cut surfaces 1b (FIG. 4). Therefore, it is possible to increase the quality factor and inductance of the chip-type coil component, to decrease the stray capacitance, and to thereby efficiently improve performance.

Since the parts on the cutting line A where the slits S are formed (the electrodes 2b serving as the connecting electrodes) are thinner than other parts in the abovedescribed method of this preferred embodiment, it is possible to further reduce the amount of the electrodes (metal films) to be cut by the cutting blade in the cutting step, to reduce the wear of the cutting blade, and to substantially prolong the life of the cutting blade.

While chip-type coil components are manufactured in the above preferred embodiment, the present invention is applicable not only to the chip-type coil components, but also to various types of electronic components in which a device pattern (electrode) including a resistor, a capacitor, and the like is formed on the surface of a substrate.

Furthermore, while the electrode pattern is formed only on one side of the mother substrate in the above preferred embodiment, the present invention is also applicable to a case in which electrode patterns are formed on both sides of the mother substrate.

While the present invention has been described with respect to particular illustrative preferred embodiments thereof, it is to be understood that the present invention is not limited to the above described embodiment and that various applications and modifications may be made without departing from the spirit and scope of the invention.

What is claimed is:

1. A method of manufacturing an electronic component, the method comprising the steps of:

forming a mother substrate having an electrode located thereon;

forming at least one slit in the electrode which is located on a cutting line on the surface of said mother substrate such that the at least one slit extends in a direction which intersects the cutting line; and cutting said mother substrate along the cutting line to form two opposing cut surfaces, while cutting said electrode including said at least one slit so as to expose said electrode on the two opposing cut surfaces which define edge surfaces of said electronic component and an adjacent electronic component.

2. A method according to claim 1, wherein a length L of said at least one slit in the direction intersecting the cutting line satisfies the following formula (1):

$$L > Wb + 2\alpha \quad (1)$$

where Wb represents a thickness of a cutting blade used in said step of cutting, and a represents an amount of offset of a cutting position in a direction of thickness of said cutting blade.

3. A method according to claim 1, further comprising the step of forming an insulating and protective film on the surface of said mother substrate, wherein said mother substrate is cut along the cutting line after the step of forming said insulating and protective film on the surface of said mother substrate.

4. A method according to claim 1, wherein a thickness of a portion of said electrode on said mother substrate, which is formed at least on the cutting line and provided with said at least one slit, is smaller than that of other portions of said electrode.

5. A method according to 1, wherein said electrode exposed on said cut surfaces is a connecting electrode which is arranged for connection to an outer electrode of an external electronic component.

6. A method according to claim 1, wherein said at least one slit is substantially perpendicular to said cutting line.

7. A method according to claim 1, further comprising the step of forming a plurality of slits in said electrode on said mother substrate.

8. A method according to claim 7, wherein said plurality of slits are substantially parallel to each other and substantially perpendicular to said cutting line.

9. A method according to claim 1, wherein the electrode on the mother substrate includes a plurality of connecting electrodes and a thin-film coil pattern, a thickness of the connecting electrodes being less than a thickness of the thinfilm coil pattern.

10. A method according to claim 9, wherein the at least one slit is formed in one of the connecting electrodes.

11. A method according to claim 9, further comprising the step of forming a plurality of slits in said electrode on said mother substrate, wherein the plurality of slits are formed in the connecting electrodes.

12. A method according to claim 1, further comprising the step of forming an insulating and protective film on the surface of said mother substrate, wherein said step of cutting along the cutting line produces pits and projections on the electrode such that the insulating and protective film enters the pits and secures the electrode on the mother substrate.

13. A method of manufacturing a plurality of electronic components, the method comprising the steps of:

forming a mother substrate having an electrode and the plurality of electronic components located thereon;

forming at least one slit in the electrode which is located along a cutting line between adjacent ones of the plurality of electronic components; and cutting said mother substrate along the cutting line to form two opposing cut surfaces while cutting along said at least one slit so as to expose said electrode on the two opposing cut surfaces which define edge surfaces of two of said electronic components.

14. A method according to claim 13, wherein said electrode includes a plurality of connecting electrodes which are formed at locations bridging adjacent ones of the plurality of electronic components, the at least one slit being formed in one of said connecting electrodes.

15. A method according to claim 13, further comprising the step of forming a plurality of slits in said electrode.

16. A method according to claim 15, wherein said electrode includes a plurality of connecting electrodes which are formed at locations bridging adjacent ones of the plurality of electronic components, the plurality of slits being formed in said connecting electrodes.

17. A method according to claim 13, wherein a length L of said at least one slit in the direction intersecting the cutting line satisfies the following formula (1):

$$> Wb + 2\alpha \quad (1)$$

where Wb represents a thickness of a cutting blade used in said step of cutting, and a represents an amount of offset of a cutting position in a direction of thickness of said cutting blade.

18. A method according to claim 13, further comprising the step of forming an insulating and protective film on the surface of said mother substrate, wherein said mother substrate is cut along the cutting line after the step of forming said insulating and protective film on the surface of said mother substrate.

19. A method according to claim 13, wherein a thickness of a portion of said electrode on said mother substrate, which is formed at least on the cutting line and provided with said at least one slit, is smaller than that of other portions of said electrode.

20. A method according to 13, wherein said at least one slit is substantially perpendicular to said cutting line.

21. A method of manufacturing an electronic component, the method comprising the steps of:

forming a mother substrate having an electrode located thereon;

forming at least one slit in the electrode which is located on a cutting line on the surface of said mother substrate such that the at least one slit extends in a direction which intersects the cuffing line;

cutting said mother substrate along the cutting line to form two opposing cut surfaces, while cutting said electrode including said at least one slit so as to expose said electrode on the two opposing cut surfaces which define edge surfaces of said electronic component and an adjacent electronic component; and connecting said electrode exposed on said two opposing cut surfaces to an outer electrode of said electronic component.

* * * * *